United States Patent
Lu et al.

(10) Patent No.: US 8,026,571 B2
(45) Date of Patent: Sep. 27, 2011

(54) SEMICONDUCTOR-DEVICE ISOLATION STRUCTURE

(75) Inventors: Shui-Yen Lu, Hsinchu County (TW); Guang-Wei Ye, Tainan (TW); Shin-Chi Chen, Tainan County (TW); Tsung-Wen Chen, Taipei (TW); Ching-Fang Chu, Hsinchu County (TW); Chi-Horn Pai, Taipei (TW); Chieh-Te Chen, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 390 days.

(21) Appl. No.: 12/129,656

(22) Filed: May 29, 2008

(65) Prior Publication Data

US 2009/0294927 A1 Dec. 3, 2009

(51) Int. Cl.
*H01L 23/58* (2006.01)

(52) U.S. Cl. .. 257/506; 257/510; 257/647; 257/E21.553

(58) Field of Classification Search .................. 257/510, 257/647, E21.553, 506
See application file for complete search history.

(56) References Cited

U.S. PATENT DOCUMENTS

| | | | |
|---|---|---|---|
| 6,174,784 B1 * | 1/2001 | Forbes | 438/405 |
| 7,190,036 B2 | 3/2007 | Ko | |
| 7,332,790 B2 * | 2/2008 | Gonzalez et al. | 257/513 |
| 7,445,973 B2 * | 11/2008 | Gonzalez et al. | 438/158 |
| 7,482,229 B2 * | 1/2009 | Juengling | 438/268 |

* cited by examiner

*Primary Examiner* — Eugene Lee
(74) *Attorney, Agent, or Firm* — Winston Hsu; Scott Margo

(57) ABSTRACT

A manufacturing method for a semiconductor-device isolation structure comprises providing a substrate with at least one shallow trench isolation structure, performing a salicide process that forms a recess on the surface of the shallow trench isolation structure, forming a cap film covering the substrate and filling the recess, performing an etching process to remove the cap film outside the recess, and forming a contact etch stop layer covering the substrate and filling the recess. Due to the filling recess with the cap film first, the contact etch stop layer covering the substrate and filling the recess does not have seams or voids.

5 Claims, 6 Drawing Sheets

SEMICONDUCTOR-DEVICE ISOLATION STRUCTURE

BACKGROUND OF THE INVENTION

1. Field of the Invention

The present invention relates to a semiconductor-device isolation structure, and more particularly, to a manufacturing method for preventing contact etch stop layers from having seams or voids, so that short-circuiting between contact plugs formed in the following process can be avoided.

2. Description of the Prior Art

Traditional field oxide (FOX) structures applied to isolate the semiconductor devices are formed by a method of local oxidation of silicon (LOCOS). However, the isolating method of LOCOS has several disadvantages of lateral growth of the field oxide, lateral diffusion of field doping ions, thinning effect in small-sized field oxide and bird's beak, so shallow trench isolation (STI) structures are developed to manufacture the deep sub-micron integrated circuit. The processes of forming the STI structure are described as follows. First, a trench is formed in the semiconductor substrate. Then, the trench is filled with an insulating material, and the insulating material is planarized to be the insulating region used for isolation, so that the bird's beak of the LOCOS will not occur. The STI structure has advantages of small isolation line width, explicit division of active regions, uniform depth of isolation regions, scalable size and excellent planar structure of isolation regions so as to become a preferably ideal isolation technology at present. Therefore, the STI structure is widely applied to manufacture the integrated circuits in 0.25 micron.

Referring to FIG. 1 and FIG. 2, FIG. 1 is a top view illustrating a layout of a semiconductor device, such as DRAM, according to the prior art, and FIG. 2 is a cross-sectional view illustrating a semiconductor-device isolation structure shown in FIG. 1 along a line AA'. As shown in FIG. 1, in the processes of forming each transistor of a memory cell, first, at least one STI structure 102 is formed on the substrate 100, and the STI structure 102 defines a plurality of active regions 104. Each active region 104 is isolated from the other adjacent active regions 104 by the STI structure 102. Next, a plurality of gate structures 106 are formed on each active region 104 and the STI structure 102, and then, spacers 108 are respectively formed on the sidewall of each gate structure 106. Next, a self-aligned silicide (salicide) process is performed to form corresponding silicide layers respectively disposed on each gate structure 106 and each active region 104.

However, during the manufacturing processes of the semiconductor device according to the prior art, the etching process and the cleaning process, such as an etching process for removing a cap layer and a hard mask layer on each transistor, an etching process for forming spacers 108, a pre-cleaning process performed after the etching process for forming the spacers 108, a cleaning process performed after forming the source electrode/drain electrode in the active region 104, a pre-cleaning process performed before forming the silicide layers, and an etching process for removing metal layers without reacting, are performed several times. During the etching processes and the cleaning processes, the exposed STI structure 102 is damaged by the etching processes and the cleaning processes so as to form recesses 110, which possibly have depths about several hundred angstroms or more, disposed on the surface of the STI structure 102 between any of two adjacent gate structures 106, as shown in FIG. 2. Because the isotropic etching processes and the cleaning processes, especially the pre-cleaning process before the salicide process and the etching process after the salicide process, cause deep and lateral corrosion for the STI structures 102, the recesses 110 are enlarged to be under the spacers 108 or even under the gate structures 106 so as to cause the leakage current in the device.

In addition, because a method for reducing the size of the device to raise the performance of a metal-oxide-semiconductor field-effect transistor (MOSFET) also suffers from limits of technology and expensive cost in the photolithographic process, most of the current semiconductor processes utilize a strained-Si channel technology, such as utilizing a contact etch stop layer (CESL) with compressed/strained stress, to raise mobility of carriers so as to increase driving current of the device. Referring to FIG. 3, FIG. 3 is a cross-sectional view illustrating the semiconductor-device isolation structure shown in FIG. 2 further having the CESL formed thereon. As shown in FIG. 3, in the following process used to form a CESL 112, due to the recesses 110 on the surface of the STI structure 102 and the tightness between each gate structure 106, a chemical vapor deposition (CVD) process used to deposit the CESL 112 easily causes an effect of overhang. For this reason, the CESL 112 covering the substrate 100 and filling the recesses 110 has the overhangs at openings of the recesses 110, and a portion of the overhangs even connect to each other so as to have seams or voids 114.

Next, in the following process, the CESL is covered with an inter-layer dielectric (ILD) layer, and then, corresponding contact windows are respectively formed on the gate electrode and the source-electrode/drain-electrode doping region of each transistor. Thereafter, the contact windows are filled with tungsten to form tungsten plugs. Because the seams or voids in the CESL on the STI structure and the great gap-fill ability of tungsten in the CVD process of tungsten, tungsten will fill the seams or voids of the CESL in the process of forming the tungsten plugs. Therefore, adjacent tungsten plugs have a contact bridge so as to connect to each other, so the integrated circuits cannot regularly operate.

SUMMARY OF THE INVENTION

It is therefore a primary object of the claimed invention to provide a semiconductor-device isolation structure and a manufacturing method thereby to prevent the short-circuiting of the adjacent contact plugs resulting from the seams or voids in the CESL.

According to the claimed invention, a manufacturing method for a semiconductor-device isolation structure is provided. First, a substrate with at least one shallow trench isolation (STI) structure is provided. Next, a salicide process is performed, and a recess is formed on the surface of the STI structure in the salicide process. Then, a cap film is formed to cover the substrate and fill the recess. Thereafter, an etching process is performed to remove the cap film outside the recess. Finally, a contact etch stop layer is formed to cover the substrate and fill the recess.

According to the claimed invention, a semiconductor-device isolation structure is provided. The semiconductor-device isolation structure comprises a substrate, at least one STI structure disposed in the substrate, at least two gate structures disposed on a surface of the STI structure, a cap film and a CESL. The surface of the STI structure between the gate structures has a recess. Sidewalls of the gate structures all respectively have a spacer, and the recess further has an extension disposed under the spacers. The cap film fills the extension of the recess, and the CESL covers the gate structures and the STI structure and fills the recess.

The manufacturing method of the semiconductor-device isolation structure according to the present invention provides the cap film to fill the recess of the STI structure between any two of the adjacent gate structures, so that the step coverage of the CESL formed in the following process can be raised so as to totally cover the substrate 200 and fill the recess 212 without forming the seams or voids. Therefore, the semiconductor-device isolation structure can effectively prevent adjacent contact plugs from having the contact bridge.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
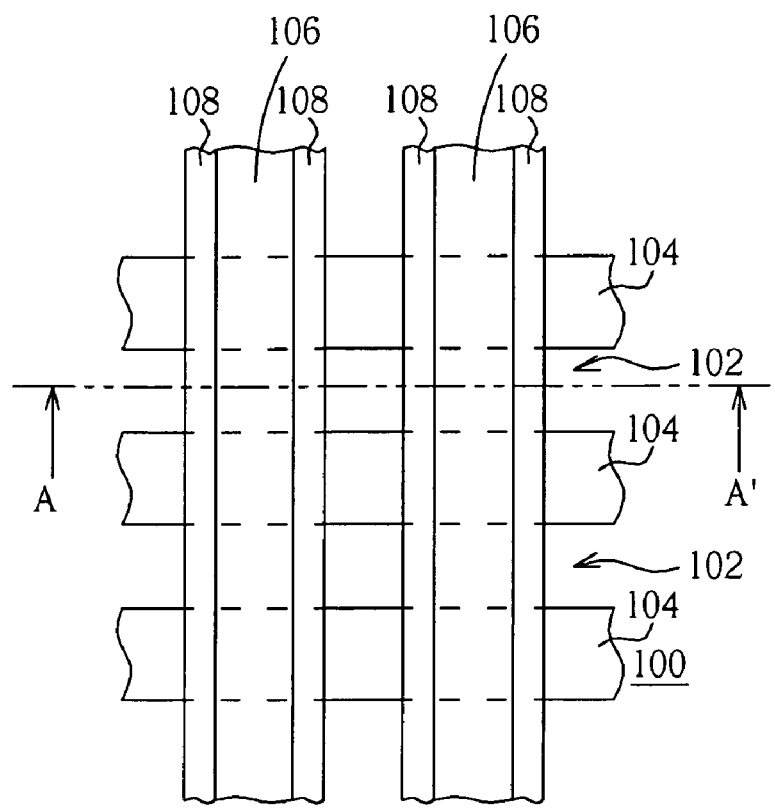
FIG. 1 is a top view illustrating a layout of a semiconductor device according to the prior art.
Figure 2:
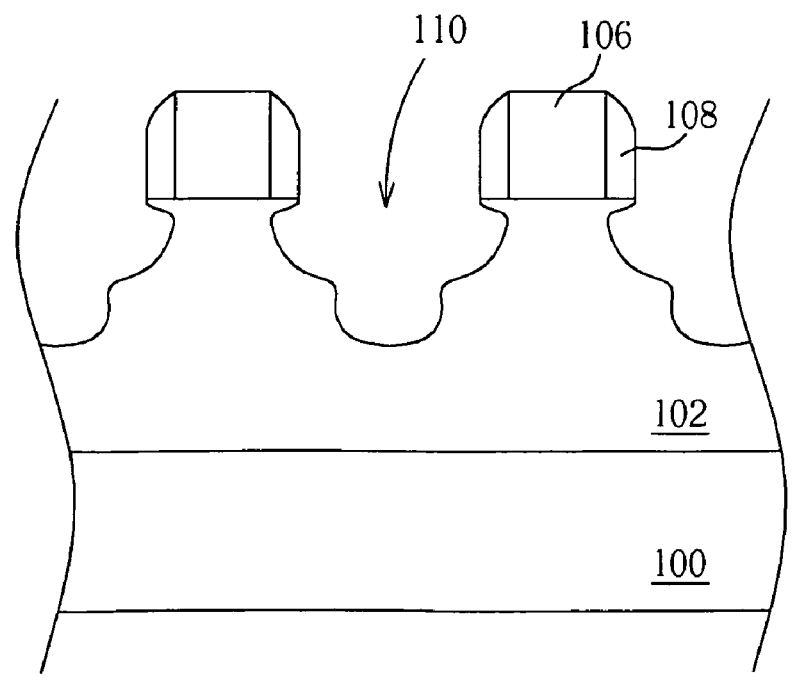
FIG. 2 is a cross-sectional view illustrating a semiconductor-device isolation structure shown in FIG. 1 along a line AA'.
Figure 3:
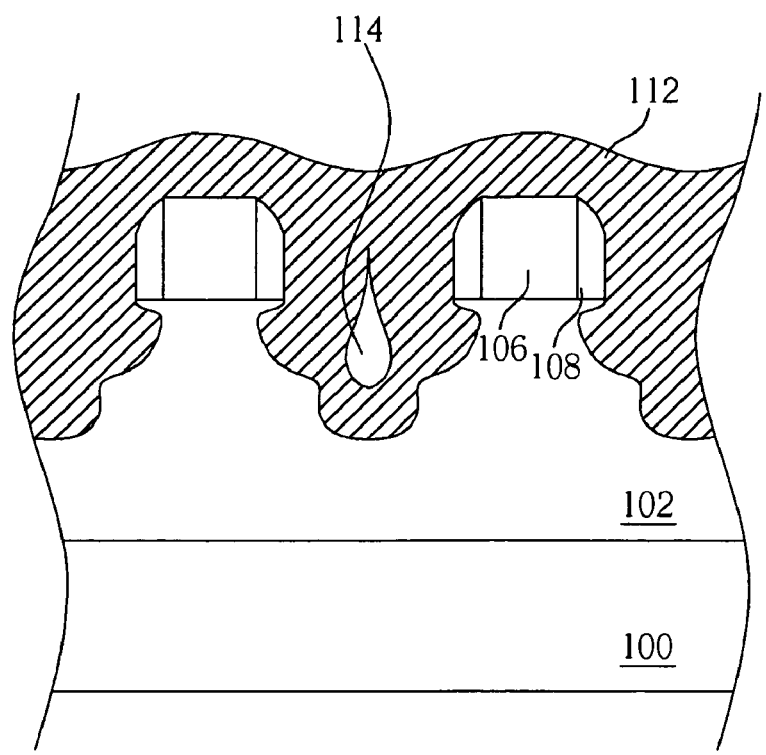
FIG. 3 is a cross-sectional view illustrating the semiconductor-device isolation structure shown in FIG. 2 further having the CESL formed thereon.
Figure 4:
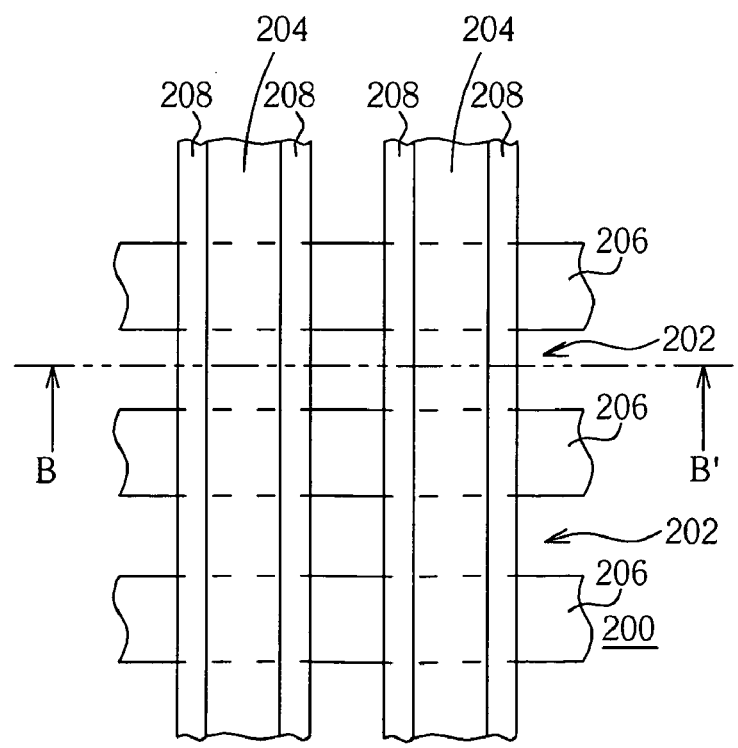
FIG. 4 is a top view illustrating a layout of a semiconductor device according to a preferred embodiment of the present invention.
Figure 5:
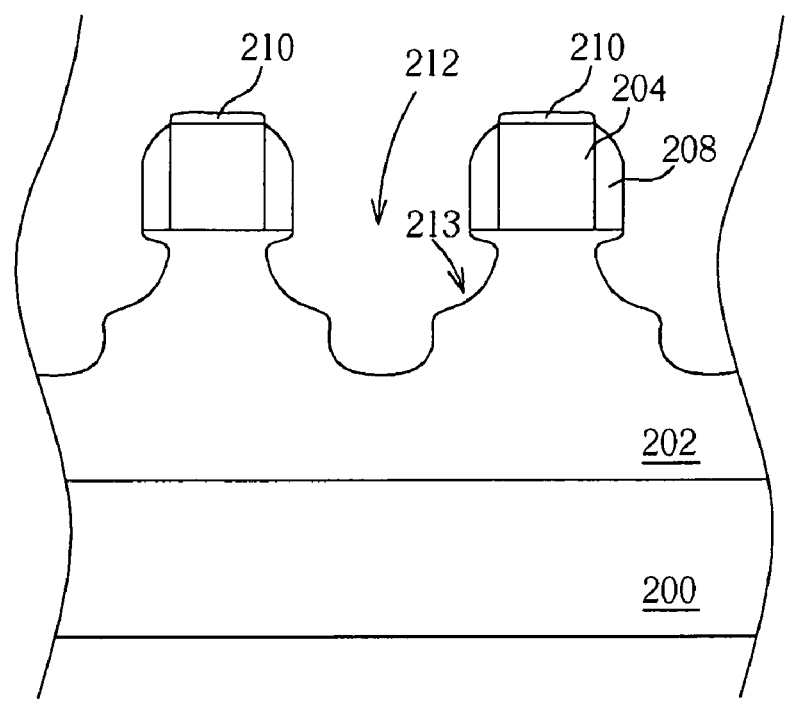
FIG. 5 through FIG. 9 are schematic diagrams illustrating a manufacturing method of a semiconductor-device isolation structure shown in FIG. 4 along line BB' according to a preferred embodiment of the present invention.

Referring to FIG. 4 through FIG. 9, FIG. 4 is a top view illustrating a layout of a semiconductor device, such as a memory cell of a DRAM, according to a preferred embodiment of the present invention, and FIG. 5 through FIG. 9 are schematic diagrams illustrating a manufacturing method of a semiconductor-device isolation structure shown in FIG. 4 along line BB' according to a preferred embodiment of the present invention. As shown in FIG. 4 and FIG. 5, first, a substrate 200, such as a silicon wafer or an SOI substrate etc., is provided. The substrate 200 comprises at least one shallow trench isolation (STI) structure 202 and a plurality of gate structures 204 disposed on the STI structure 202 and the substrate 200. The STI structure 202 defines a plurality of active regions 206, and the STI structure 202 is used to isolate each active region 206. In addition, a sidewall of each gate structure 204 respectively has a spacer 208 formed thereon. The STI structure 202, the gate structures 204 and the spacers 208 can be formed with any suitable process according to the prior art.

Next, a salicide process is performed to form silicide layers 210 respectively disposed on each gate structure 204 or silicide layers (not shown in figure) respectively on the active region 206 uncovered with the gate structures 204 and the spacers 208. The salicide process comprises a pre-cleaning process performed for a surface of the substrate 200, a deposition process performed to deposit a metal layer and a cap layer (not shown in figure) on the substrate 200, a rapid thermal annealing (RTA) process to form the silicide layer 210 and an etching process performed to remove the cap layer and the metal layer without reacting.

As shown in FIG. 5, it should be noted that the processes, such as an etching process for removing a cap layer and a hard mask layer on each transistor, an etching process for forming the spacers 208, a pre-cleaning process performed after the etching process for forming the spacers 208, a cleaning process performed after forming the source electrode/drain electrode in the active region 206, a pre-cleaning process performed before forming the silicide layer 210, and an etching process for removing the metal layer without reacting, performed between the process of forming the STI structure 202 and the process of forming the silicide layer 210 may damage the exposed portion of the STI structure 202, so that a surface of the STI structure 202 uncovered with the gate structures 204 and the spacers 208 has a plurality of recesses 212 thereon. Especially, the pre-cleaning process before the salicide process and the etching process after the salicide process cause greater affections for the STI structure 202. In addition, the recess 212 formed on the STI structure 202 between any of two adjacent gate structures 204 has an extension 213 under the spacers 208 so as to cause a phenomenon of undercut at the bottom of the spacers 208.

Figure 6:
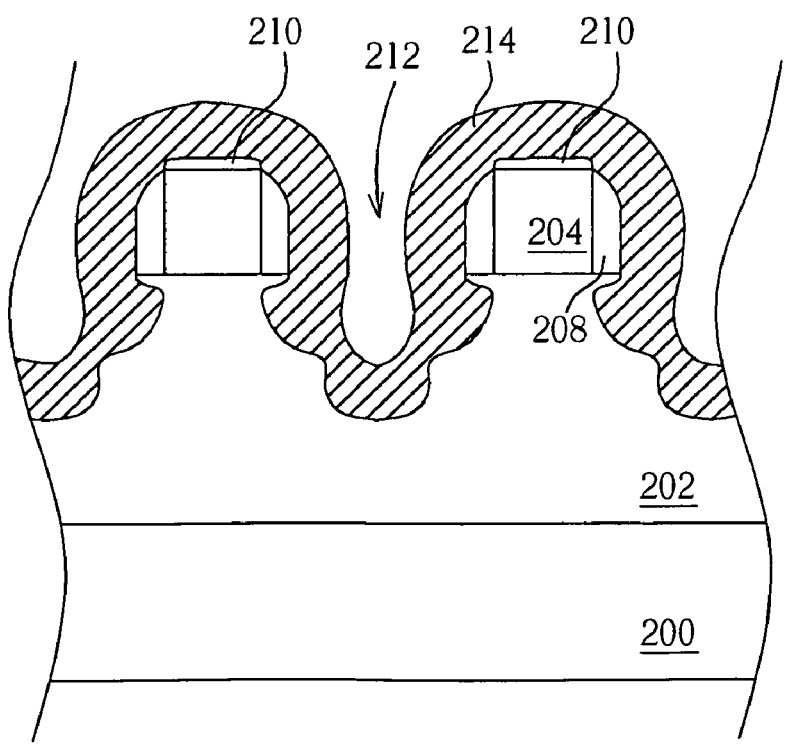

As shown in FIG. 6, next, a deposition process, such as a chemical vapor deposition (CVD) process, is performed to form a cap film 214 to cover the substrate 200. At the same time, the cap film 214 is formed on the surface of the recesses 212 so as to fill the recesses 212 under the spacers 208. Especially, the extension 213 of the recess 212 is substantially filled with the cap film 214, so that the profile of the recess 212 can be modified so as to prevent the seams and the voids from being generated in the following process for filling the recess 212. The material of the cap film 214 can be an insulating material of an oxide, such as silicon oxide, or a nitride, such as silicon nitride, but the material of the cap film 214 also can be selected according to actual requirements or process yields. In addition, the cap film 214 can further comprise an oxide layer regarded as an etch stop layer in the following etching process. This means that this preferred embodiment can further form an oxide layer on the substrate 200 before forming the main-material layer of the cap film 214, such as nitride. Then, the main-material layer of the cap film 214 is formed. Therefore, the silicide layers 210 on the gate structures 204 or the active regions 206 can be prevented from being damaged by the following etching process for removing the main-material layer of the cap film 214 outside the recesses 212. Furthermore, the cap film 214 also can be a multi-layer structure composed of a plurality of oxide layers, nitride layers or a combination thereof.

Figure 7:
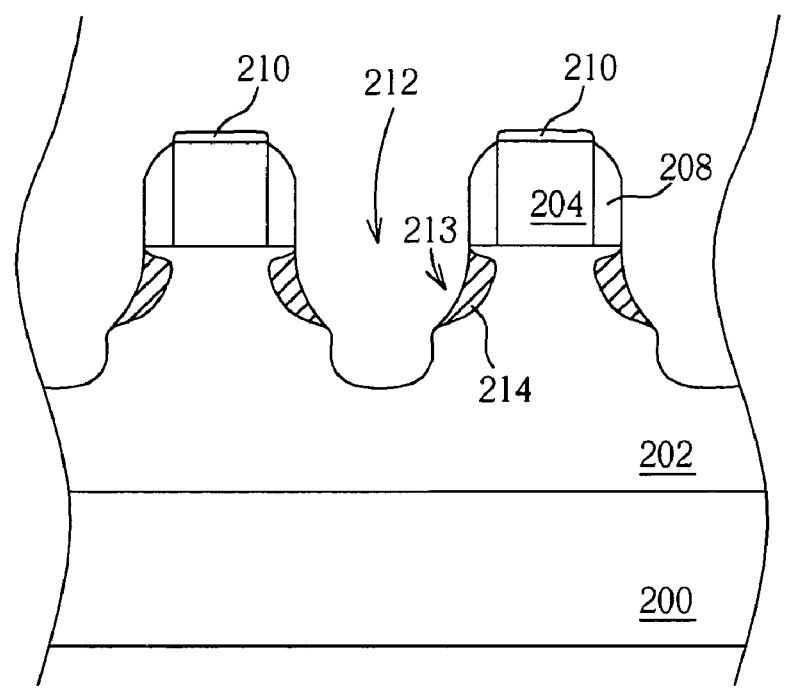
Figure 8:
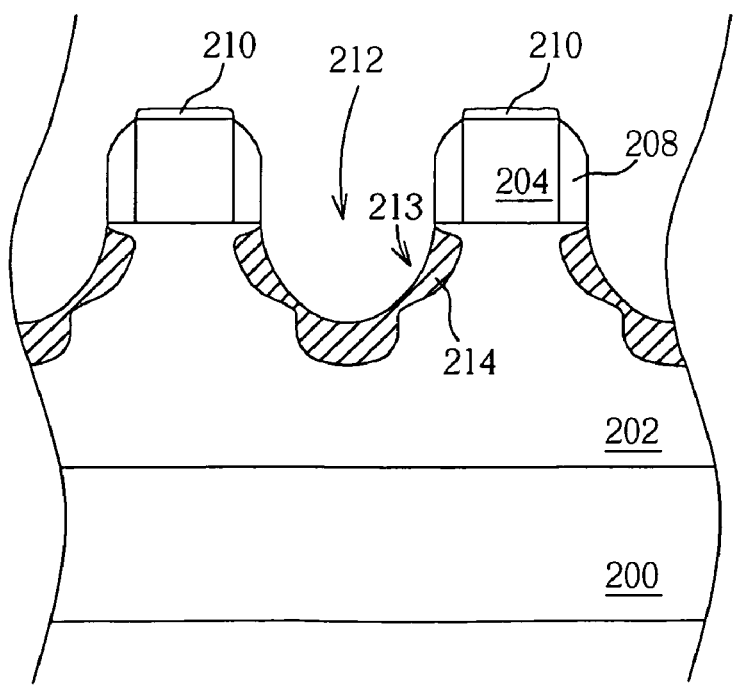

Then, as shown in FIG. 7, an etching process is performed to remove the cap film 214 outside the recesses 212. This means only a portion of the cap film 214 remain in the recesses 212 after the etching process. The remaining cap film 214 is utilized to fill the extension 213 of the recess 212 under the spacers 208 and to modify the profile of the recess 212. The etching process can be an anisotropic etching process, such as plasma etching process, so that the sidewall of the recess 212 has much more cap film 214 remaining thereon so as to help the following deposition process easily to perform. It should be noted that according to different etching condition, the remaining cap film 214 can not only be formed in the extension 213 and formed on the sidewall of the recess 212, but also the portion of the remaining cap film 214 can further be formed on the bottom of the recess 212, as shown in FIG. 8. The remaining cap film 214 filling the whole extension 213 and the bottom of the recess 212 is preferred. Besides, after the etching process, a plasma and solvent cleaning process can be selectively performed to clean contaminants on the substrate 200.

Figure 9:
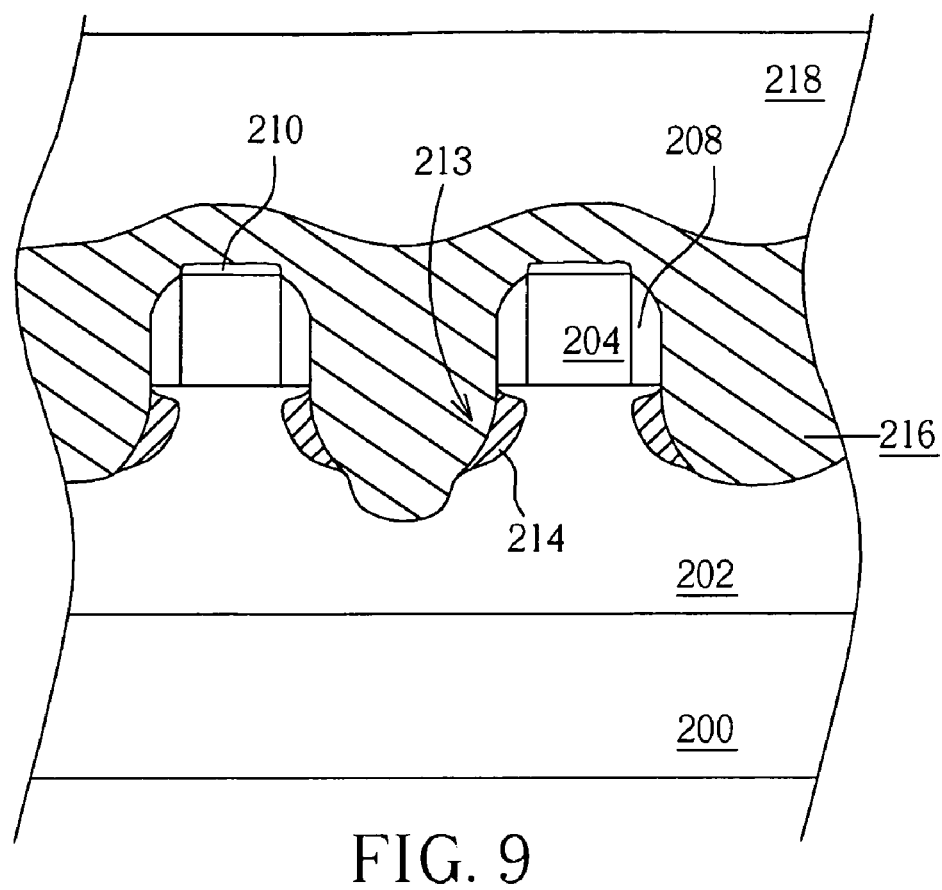

Finally, as shown in FIG. 9, an ex-situ deposition process, such as a CVD process, is performed to form a contact etch stop layer (CESL) 216 to cover the substrate 200 and fill the recesses 212 along the cap film 214. The ex-situ process is performed in a different machine. This means the cap film 214 and the CESL 216 are formed in different machines. It should be noted that this preferred embodiment fills the sidewall, the extension 213 and the bottom of the recess 212 with the cap film 214 to modify the profile of the recess 212 before forming the CESL 216. For this reason, the CESL 216 filling the recesses 212 do not have seams or voids, so that tungsten formed in the following process can be effectively prevented from filling the seams or voids of the CESL 216 so as to avoid the adjacent contact plugs from having the contact bridge. In addition, the CESL 216 simultaneously has a function of the etch stop layer and a function of providing the compressed/strained stress, so the material of the CESL 216 can mainly be a material, which simultaneously has a function of the etch stop layer and a function of providing the compressed/strained stress, for example the CESL 216 of this embodiment can be silicon nitride, but the present invention is not limited to this. Next, a curing process, such as ultraviolet curing process or rapid thermal process (RTA), can be selectively performed to make the CESL 216 have higher stress so as to raise the mobility of carriers in the channel and improve the driving current of the device. Then, an inter-layer dielectric (ILD) layer 218 is formed to cover the CESL 216, and a contact plug process is performed. In addition, because the cap film 214 and the CESL 216 are formed in different machines, the material of the cap film 214 can be different from the material of the CESL 216. For example, the cap film 214 can be oxide, and the CESL 216 can be silicon nitride. The stress of the CESL 216 is larger than the stress of the cap film 214. In order to make the CESL 216 have much more affections for the lattice structure in the channel, the position of the CESL 216 should be closer to the channel. Therefore, in this embodiment, the cap film 214 disposed on the gate structures 204 and the active regions 206 should be removed as cleanly as possible, so that the following CESL 216 can directly cover the gate structures 204 and the active regions 206. The stress provided by the CESL 216 can strain or compress the substrate 200 under the gate structures 204 in the active region 206 so as to change the lattice orientation of the channel. Therefore, the mobility of the carriers in the channel is raised, and the driving current of the device is increased.

It should be noted that the processes of forming the cap film 214 and forming the CESL 216 are not limited to the above-mentioned embodiment, which utilizes the ex-situ processes respectively performed in different machines, and the processes also can be performed in different chambers of an in-situ machine or in a same chamber of an in-situ machine. In the condition of the cap film 214 and the CESL 216 being formed in different chambers of an in-situ machine, the deposition processes used to form the cap film 214 and the CESL 216 should be the same, but the material of the cap film 214 and the CESL 216 can be different due to the processes performed in different chambers. The process of forming the cap film 214 also may not comprise the curing process required for forming the CESL 216. Besides, in the condition of the cap film 214 and the CESL 216 being formed in the same chamber of an in-situ machine, the deposition processes used to form the cap film 214 and the CESL 216 are the same, and the curing process can selectively be performed. Furthermore, in order to avoid the contaminations of the chamber, the materials of the cap film 214 and the CESL 216 can be the same, so that the cap film 214 can be regarded as a portion of the CESL 216. The stress of the cap film 214 is therefore equal to the stress of the CESL 216 so as to have the same stress for the channel. In other words, when the cap film 214 and the CESL 216 are formed in the same chamber, the processes of forming the cap film 214, performing etching process and forming the CESL 216 can be a deposition/etch/deposition process. That means this embodiment can utilize the process, which is traditionally used to form the CESL 216, to form the cap film 214, to etch some portion of the cap film 214 and to form the CESL 216. For example, a high-density-plasma chemical-vapor deposition (HDP CVD) simultaneously has the features of chemical vapor deposition and physical etching. In the HDP CVD process, the portion of the cap film 214 outside the recesses 212 is etched by plasma bombarding or adjusting the rate of the physical-sputter etching and the CVD after depositing the cap film 214, and then, the CESL 216 is directly deposited in the recess 212.

In addition, the CESL 216 further can be a multi-layer structure, and each layer can have different values of stress. This means that the process of forming the CESL 216 can comprise a plurality of single-stage deposition processes, and the curing processes are respectively performed after each single-stage deposition process. Therefore, each layer of the CESL 216 has high stress, so that the CESL 216 with multi-layer can have high stress.

Figure 10:
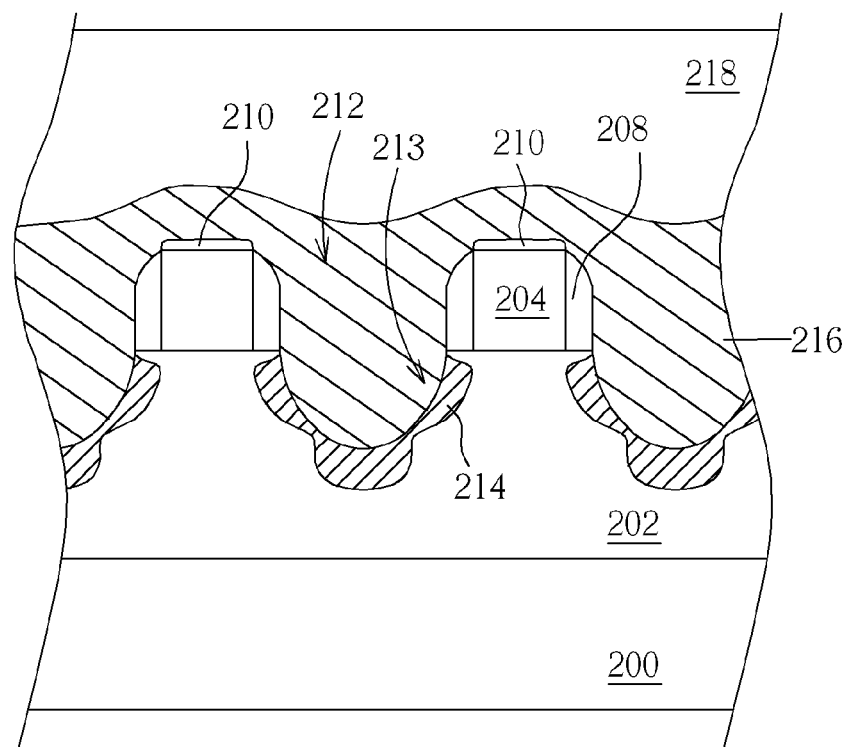
FIG. 10 is a cross-sectional view illustrating a semiconductor-device isolation structure according to another preferred embodiment of the present invention.
Figure 11:
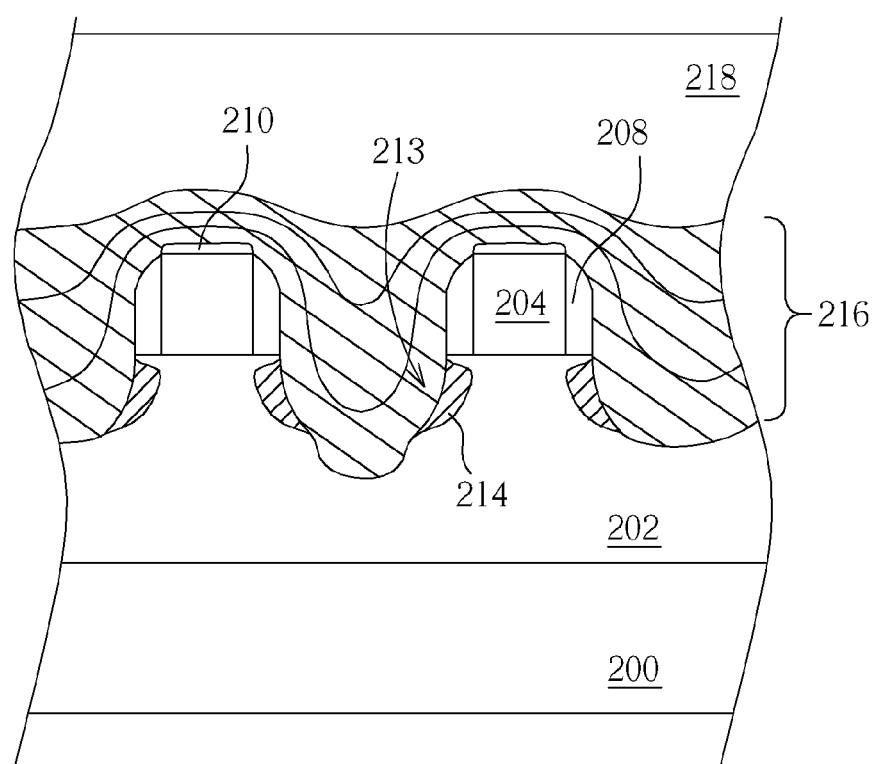
FIG. 11 is a cross-sectional view illustrating a semiconductor-device isolation structure according to another preferred embodiment of the present invention.

As shown in FIG. 4 and FIG. 9, a semiconductor-device isolation structure manufactured by the above-mentioned method comprises a substrate 200, at least one STI structure 202, a plurality of gate structures 204, a plurality of spacers 208, a cap film 214 and a CESL 216. The STI structure 202 is disposed in the substrate 200, and the STI structure 202 defines a plurality of active regions 206. Each gate structure 204 is disposed on the STI structure 202 and the active regions 206, and the sidewall of each gate structure 204 all respectively has a spacer 208 disposed thereon. The surface of the STI structure 202 between any two of the adjacent gate structures 204 has a recess 212, and each recess 212 further has an extension 213 disposed under the spacers 208. It should be noted that the cap film 214 fills the extensions 213 of the recesses 212. Furthermore, the CESL 216 covers the gate structures 204 and the STI structure 202, and the CESL 216 fills the recesses 212 along the cap film 214 in the recesses 212 and covers the cap film 214. Therefore, the cap film 214 fills the extensions 213 of the recesses 212, which cause the spacers 208 to have a phenomenon of undercut, in advance, so that the step coverage of the CESL 216 formed in the following process can be raised so as to totally cover the substrate 200 and fill the recesses 212 without forming the seams or voids. But, the semiconductor-device isolation structure of the present invention is not limited to the cap film 214 only filling the extensions 213 of the recesses 212. Referring to FIG. 10, FIG. 10 is a cross-sectional view illustrating a semiconductor-device isolation structure shown in FIG. 4 along line BB' according to another preferred embodiment of the present invention. As shown in FIG. 10, the semiconductor isolation structure can further comprise the cap film 214 disposed on the bottom of the recesses 212. Referring to FIG. 11, FIG. 11 is a cross-sectional view illustrating a semiconductor-device isolation structure shown in FIG. 4 along line BB' according to another preferred embodiment of the present invention. As shown in FIG. 11, the CESL 216 further can be a multi-layer structure, and each layer can have different values of stress.

In summary, the manufacturing method of the semiconductor-device isolation structure according to the present invention provide the cap film to fill the recess of the STI structure between any two of the adjacent gate structures formed by the cleaning process or the etching process and to modify the profile of the recess after performing the salicide process, so that the step coverage of the CESL formed in the following process can be raised so as to totally cover the substrate and fill the recesses without forming the seams or voids. Therefore, the semiconductor-device isolation structure can effectively prevent adjacent contact plugs from having the contact bridge.

Those skilled in the art will readily observe that numerous modifications and alterations of the device and method may be made while retaining the teachings of the invention.

What is claimed is:

1. A semiconductor-device isolation structure, comprising:
a substrate;
at least one shallow trench isolation structure on the substrate;
at least two gate structures and each of which respectively has a spacer, bottoms of the gate structures being disposed on a top surface of the shallow trench isolation structure, and a surface of the shallow trench isolation structure between the gate structures having a recess thereon, wherein the recess further has an extension disposed under the spacers;
a cap film filling the extension of the recess; and
a contact etch stop layer covering the gate structures and the shallow trench isolation structure and filling the recess.

2. The semiconductor-device isolation structure of claim 1, wherein the cap film further covers the bottom of the recess.

3. The semiconductor-device isolation structure of claim 1, wherein the cap film comprises an oxide, a nitride or a combination thereof.

4. The semiconductor-device isolation structure of claim 1, wherein a stress of the contact etch stop layer is larger than or equal to a stress of the cap film.

5. The semiconductor-device isolation structure of claim 1, wherein the contact etch stop layer is a multi-layer structure.

* * * * *